US008648459B2

(12) United States Patent
Lee (10) Patent No.: US 8,648,459 B2
(45) Date of Patent: Feb. 11, 2014

(54) NITRIDE BASED SEMICONDUCTOR PACKAGE AND METHOD OF MANUFACTURING THE SAME AND BONDING SUBSTRATE

(75) Inventor: Jae Hoon Lee, Gyunggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/605,112

(22) Filed: Sep. 6, 2012

(65) Prior Publication Data

US 2013/0056750 A1 Mar. 7, 2013

(30) Foreign Application Priority Data

Sep. 6, 2011 (KR) .................. 10-2011-0090379

(51) Int. Cl.
*H01L 23/04* (2006.01)
*H01L 21/28* (2006.01)

(52) U.S. Cl.
USPC ............ 257/698; 257/E29.089; 257/E21.499; 438/604

(58) Field of Classification Search
CPC .................. H01L 21/02458; H01L 21/0254; H01L 33/007; H01L 21/25575; H01L 2924/01079; H01L 2824/01078; H01L 2924/15311
USPC .................... 257/76, 698, E29.089, E21.499; 438/106, 107, 604, 761
See application file for complete search history.

(56) References Cited

U.S. PATENT DOCUMENTS

| 6,198,166 | B1 | 3/2001 | Coronati |
| 7,759,161 | B2 * | 7/2010 | Tanaka et al. .................. 438/106 |
| 7,781,873 | B2 * | 8/2010 | Koh et al. ...................... 257/673 |
| 2005/0017333 | A1 * | 1/2005 | Bohr .............................. 257/678 |
| 2009/0090984 | A1 * | 4/2009 | Khan et al. .................... 257/409 |

FOREIGN PATENT DOCUMENTS

| JP | 2001-185643 A | 7/2001 |
| JP | 2005-039005 A | 2/2005 |

OTHER PUBLICATIONS

Toshiba's specification of Jun. 17, 2009 at http://www.toshiba-tmat.co.jp/eng/list/ce_plain.htm.*

* cited by examiner

*Primary Examiner* — Nikolay Yushin
(74) *Attorney, Agent, or Firm* — McDermott Will & Emery LLP (57) ABSTRACT

A nitride based semiconductor package includes a nitride based semiconductor device, a package substrate, and a bonding substrate. The semiconductor device includes, on a surface thereof, a first electrode pattern having a source electrode, a drain electrode and a gate electrode. The bonding substrate includes, on a first surface thereof, a second electrode pattern corresponding to the first electrode pattern, and at least one first groove pattern. The first groove pattern exposes the second electrode pattern. The first electrode pattern is received in the at least one first groove pattern. The second electrode pattern is bonded to the first electrode pattern received in the at least one first groove pattern. A second surface of the bonding substrate is bonded to the package substrate.

18 Claims, 8 Drawing Sheets

NITRIDE BASED SEMICONDUCTOR PACKAGE AND METHOD OF MANUFACTURING THE SAME AND BONDING SUBSTRATE

CROSS-REFERENCE TO RELATED APPLICATION

This U.S. non-provisional application claims benefit of priority to Korean Patent Application No. 10-2011-0090379, filed on Sep. 6, 2011, in the Korean Intellectual Property Office, the entirety of which is hereby incorporated by reference.

BACKGROUND

1. Field

The present disclosure relates to a nitride based semiconductor package in which a nitride based semiconductor device may be readily bonded to a substrate, a method of manufacturing the same, and a bonding substrate.

2. Description of the Related Art

As information communication technologies have been considerably developed globally, communication technologies for high-speed and large-capacity signal communication have been rapidly developed. In particular, as demand for a personal cellular phone (PCS), a satellite communication, a military radar, a broadcasting communication, a communication relay, and the like in wireless communication technology has increased, demands for a high speed and power electronic device required for a high-speed information communication system of a microwave band and a millimeter-wave band have also increased.

A group III-V compound semiconductor refers to a semiconductor material formed by combining elements from group III and group V of the periodic table. The group III-V compound semiconductor is widely used for light emitting devices with high luminous efficiency, and has led a revolution in optical communication and display industries. In addition, the group III-V compound semiconductor is widely used for a high speed and power electronic devices due to a high transfer rate of electrons and a high temperature operation. By combining the group III-V compound semiconductor with other elements, other than the group III elements and the group V elements, a semiconductor composed of a wide variety of materials and having a wide variety of characteristics may be generated.

Particularly, since a nitride based semiconductor has advantageous properties, such as a high energy gap, a high heat stability, a high chemical stability, a high electronic saturation velocity of about $3 \times 10^7$ centimeters per second (cm/sec), the nitride based semiconductor may be readily utilized as a light device, and a high frequency and a high power electronic device. Accordingly, research on the nitride based semiconductor is being actively conducted around the world. An electronic device based on the nitride based semiconductor may have varied advantages, for example, a high breakdown field of about $3 \times 10^6$ volts per centimeter (V/cm), a maximum current density, a stable high temperature operation, a high heat conductivity, and the like.

A heterostructure field effect transistor (HFET) generated based on a heterojunction of a compound semiconductor is widely used for an electronic device. The HFET may refer to a heterojunction FET formed by combining different materials, for example, aluminum gallium nitride (AlGaN) and gallium nitride (GaN), or aluminum gallium arsenide (AlGaAs) and gallium arsenide (GaAs), and the like. The HFET having a compound with a high energy gap may be used for applications of high temperature, high power, and high frequency electronic devices, and therefore research on the HFET is being actively conducted. Since the HFET based on the nitride based semiconductor may have a high band discontinuity at a junction interface, high-density electrons may be freed in the interface so that electron mobility may increase. Based on such characteristics, the HFET based on the nitride based semiconductor may be applied as a high power device. A recent expansion of third generation and fourth generation wireless networks, and wireless communication, for example, mobile phones, has increased interest in and need for a power amplifier of a micro area and a radio frequency, thereby increasing a demand for the HFET based on the nitride based semiconductor greatly.

In addition, when electricity flows, the nitride based semiconductor may have a resistance lower than or equal to $\frac{1}{100}$ of a resistance of silicon. Therefore, the nitride based semiconductor may be excellent in terms of energy saving performance, when compared to silicon that is being currently used most commonly. Further, the nitride based semiconductor may have a high degree of responsiveness for minutely controlling a flow of current, and may be excellent in reducing sizes and weights of peripheral parts.

When an HFET is manufactured using a nitride based semiconductor in a conventional manner, a sapphire substrate may be used. The sapphire substrate may have a relatively low heat conductivity, when compared to a silicon substrate. Accordingly, applying the sapphire substrate to a high power device requiring a heat dissipation may he difficult.

In addition, although silicon carbide (SiC) that may be used as a substitution material may have a heat dissipation higher than the nitride based semiconductor by a factor of 2.5, SiC may be relatively expensive. Accordingly, depending on usage, SiC may be used for expensive products requiring a high withstand voltage performance greater than 1200 volts (V), while the nitride based semiconductor may be used for products requiring a withstand voltage performance ranging from 600 V to 1200 V.

Wire bonding may be performed to connect the HFET to a package. In this instance, a space for the wire bonding may be required between an electrode of a device and the package. Thus, a size of the entire device may increase and miniaturizing the device may be difficult.

In addition, since an extremely thin wire is used, inductance may occur depending on a length of the wire. Accordingly, a plurality of strands of wires may need to be connected in order to transfer high current.

SUMMARY

Examples of the present disclosure may include a nitride based semiconductor device that may reduce a size of a package and have an excellent heat dissipation by being bonded to a package substrate using a bonding substrate. Examples of the present disclosure may include a method of manufacturing the nitride based semiconductor device, and the bonding substrate.

An aspect of the present disclosure encompasses a nitride based semiconductor package including a nitride based semiconductor device, a package substrate, and a bonding substrate. The nitride based semiconductor device includes, on a surface thereof, a first electrode pattern having a source electrode, a drain electrode, and a gate electrode. The bonding substrate includes, on a first surface thereof, a second electrode pattern corresponding to the first electrode pattern, and includes at least one first groove pattern to expose the second electrode pattern. The first electrode pattern is received in the at least one first groove pattern. The second electrode pattern is bonded to the first electrode pattern received in the at least one first groove pattern. A second surface of the bonding substrate is bonded to the package substrate.

Another aspect of the present disclosure relates to a method of manufacturing a nitride based semiconductor package. The method includes providing a nitride based semiconductor device such that the nitride based semiconductor device includes, on a surface, a first electrode pattern having a source electrode, a drain electrode, and a gate electrode. A bonding substrate is provided such that the bonding substrate includes, on a first surface, a second electrode pattern corresponding to the first electrode pattern, and includes at least one first groove pattern to expose the second electrode pattern. The first electrode pattern included in the nitride based semiconductor device is bonded to the second electrode pattern such that the first electrode pattern is received in the at least one first groove pattern. A package substrate is bonded on a second surface of the bonding substrate.

Still another aspect of the present disclosure encompasses a bonding substrate for bonding a nitride based semiconductor device to a package substrate. The nitride based semiconductor device includes, on a surface thereof, a device electrode pattern having a source electrode, a drain electrode, and a gate electrode. The package substrate includes a package electrode pattern to be electrically connected to the source electrode, the drain electrode, and the gate electrode. The bonding substrate includes a first bonding electrode pattern disposed on a first surface of the bonding substrate, and corresponding to the device electrode pattern. The bonding substrate includes at least one first groove pattern to expose the first bonding electrode pattern and to receive the device electrode pattern. The bonding substrate includes a second bonding electrode pattern disposed on a second surface of the bonding substrate, and corresponding to the package electrode pattern. The bonding substrate includes at least one second groove pattern to expose the second bonding electrode pattern, and to receive the package electrode pattern.

BRIEF DESCRIPTION OF THE DRAWINGS

The foregoing and other features of the present disclosure will be apparent from more particular description of examples of the present disclosure, as illustrated in the accompanying drawings in which like reference characters may refer to the same or similar parts throughout the different views. The drawings are not necessarily to scale, emphasis instead being placed upon illustrating the principles of the examples of the present disclosure. In the drawings, the thickness of layers and regions may be exaggerated for clarity.

DETAILED DESCRIPTION

Examples of the present disclosure will be described below in more detail with reference to the accompanying drawings. The examples of the present disclosure may, however, be embodied in different forms and should not be construed as limited to the examples set forth herein. Like reference numerals may refer to like elements throughout the specification.

In the drawings, the thickness of layers and regions may be exaggerated for clarity. It will also be understood that when an element such as a layer, region or substrate is referred to as being "on" or "onto" another element, it may lie directly on the other element or intervening elements or layers may also be present.

Hereinafter, referring to the drawings, the examples of the present disclosure will be described in further detail.

Figure 1:
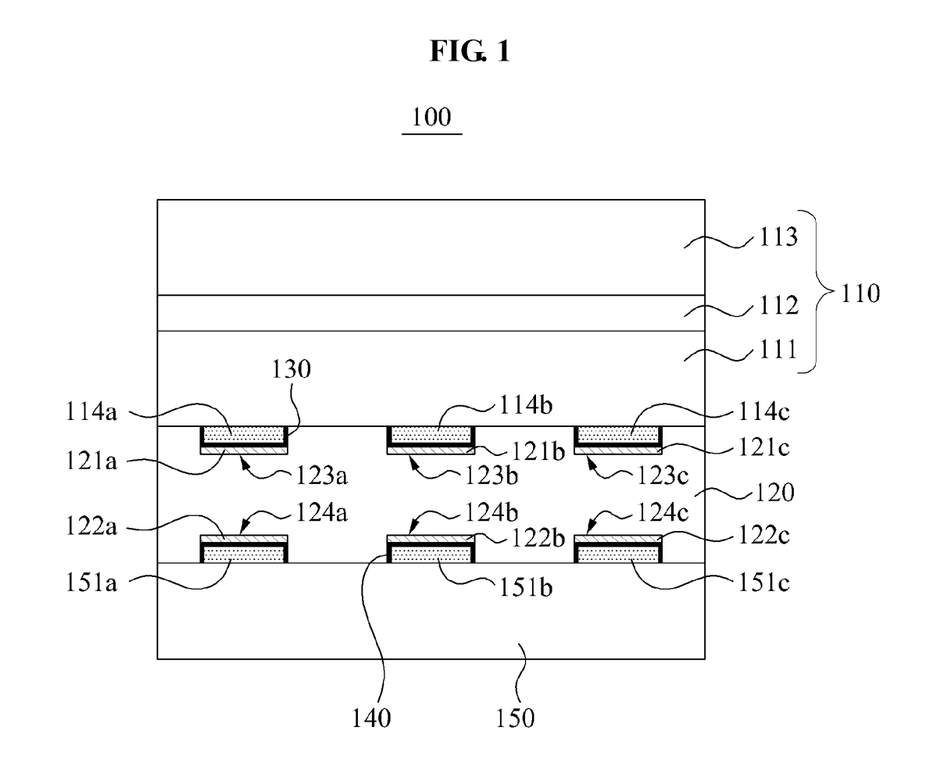
FIG. 1 is a cross-sectional view illustrating a structure of a nitride based semiconductor package according to an example of the present disclosure.

FIG. 1 is a cross-sectional view illustrating a structure of a nitride based semiconductor package 100 according to an example of the present disclosure.

Referring to FIG. 1, the nitride based semiconductor package 100 may include a nitride based semiconductor device 110, a bonding substrate 120, and a package substrate 150.

The nitride based semiconductor device 110 may include a plurality of semiconductor layers, and may include heterostructure semiconductor layers among the plurality of semiconductor layers. For example, the plurality of semiconductor layers may include an aluminum gallium nitride ($Al_xGa_{1-x}N$) 111, an aluminum doped gallium nitride (GaN) layer 112, and a high-insulating GaN layer 113 that are laminated sequentially.

In addition, the nitride based semiconductor device 110 may include, on a surface, a source electrode 114a, a drain electrode 114b, and a gate electrode 114c. The source electrode 114a, the drain electrode 114b, and the gate electrode 114c may form a first electrode pattern in the nitride based semiconductor device 110. The first electrode pattern may protrude, by a predetermined height, from a surface of the nitride based semiconductor device 110.

The nitride based semiconductor device 110 may be mounted on the package substrate 150. For example, the nitride based semiconductor device 110 may be mounted on the package substrate 150 using the bonding substrate 120.

The bonding substrate 120 may include a second electrode pattern corresponding to the first electrode pattern (e.g., the electrodes 114a, 114b and 114c) of the nitride based semiconductor device 110. In particular, the second electrode pattern may include, on a surface of the bonding substrate 120, may include a first electrode 121a, a second electrode 121b, and a third electrode 121c at positions corresponding to positions of the source electrode 114a, the drain electrode 114b, and the gate electrode 114c, respectively.

The bonding substrate 120 may include first groove patterns 123a, 123b, and 123c to expose the second electrode pattern (e.g., the electrodes 121a, 121b and 121c). The first groove patterns 123a, 123b, and 123c may be engraved patterns that are cut into the surface of the bonding substrate 120 to predetermined depths. The first electrode 121a, the second electrode 121b, and the third electrode 121c may be exposed through bottom surfaces of the first groove patterns 123a, 123b, and 123c.

The bonding substrate 120 may include a fourth electrode pattern on another surface. The fourth electrode pattern may be bonded to a third electrode pattern included in the package substrate 150, and may be formed at a position corresponding to a position of the third electrode pattern. In addition, the fourth electrode pattern may include a fourth electrode 122a, a fifth electrode 122b, and a sixth electrode 122c.

The bonding substrate 120 may include second groove patterns 124a, 124b, and 124c to expose the fourth electrode pattern (e.g., the electrodes 122a, 122b and 122c). The second groove patterns 124a, 124b, and 124c may be engraved patterns that are cut into the is other surface of the bonding substrate 120 to predetermined depths. The fourth electrode 122a, the fifth electrode 122b, and the sixth electrode 122c may be exposed through bottom surfaces of the second groove patterns 124a, 124b, and 124c.

The package substrate 150 may be provided to mount thereon the nitride based semiconductor device 110. The package substrate 150 may include the third electrode pattern to be electrically connected to the source electrode 114a, the drain electrode 114b, and the gate electrode 114c, through the bonding substrate 120. The third electrode pattern may include a seventh electrode 151a, an eighth electrode 151b, and a ninth electrode 151c. The third electrode pattern may protrude, by a predetermined height, from a surface of the package substrate 150.

Hereinafter, a bonding structure of the nitride based semiconductor device 110, the bonding substrate 120, and the package substrate 130 of FIG. 1 will be described in detail.

Referring to FIG. 1, the first electrode pattern (e.g., the electrodes 114a, 114b and 114c) of the nitride based semiconductor device 110 may be received in the first groove patterns 123a, 123b, and 123c of the bonding substrate 120. Accordingly, the first electrode pattern may be bonded to the second electrode pattern (e.g., the electrodes 121a, 121b and 121c) that is exposed through the bottom surfaces of the first groove patterns 123a, 123b, and 123c. In particular, the source electrode 114a may be bonded to the first electrode 121a, the drain electrode 114b may be bonded to the second electrode 121b, and the gate electrode 114c may be bonded to the third electrode 121c.

In order to bond the first electrode pattern (e.g., the electrodes 114a, 114b and 114c) to the second electrode pattern (e.g., the electrodes 121a, 121b and 121c), an anisotropic conductive film 130 may be attached to side surfaces and bottom surfaces of the first groove patterns 123a, 123b, and 123c. The anisotropic conductive film 130 may include conductive particles. The anisotropic conductive film 130 may have conductivity due to the conductive particles provided with a relatively small thickness in a vertical direction, whereas the anisotropic conductive film 130 may have non-conductivity with a relatively great thickness in a horizontal direction since the conductive particles are not connected to one another in the horizontal direction. Accordingly, the anisotropic conductive film 130 disposed on the side surfaces of the first groove patterns 123a, 123b, and 123c may have both a bonding function and an insulating function.

Although it is described that the anisotropic conductive film 130 is attached to the first groove patterns 123a, 123b, and 123c, as a bonding material, the bonding material is not limited to the anisotropic conductive film 130. Other bonding materials, for example, a solder ball, a metal paste, and the like may be used.

The third electrode pattern (e.g., the electrodes 151a, 151b and 151c) of the package substrate 150 may be received in the second groove patterns 124a, 124b, and 124c of the bonding substrate 120. Accordingly, the third electrode pattern may be bonded to the fourth electrode pattern (e.g., the electrodes 122a, 122b and 122c) that is exposed through the bottom surfaces of the second groove patterns 124a, 124b, and 124c. In particular, the seventh electrode 151a may be bonded to the fourth electrode 122a, the eighth electrode 151b may be bonded to the fifth electrode 122b, and the ninth electrode 151c may be bonded to the sixth electrode 122c.

In order to bond the third electrode pattern (e.g., the electrodes 151a, 151b and 151c) to the fourth electrode pattern (e.g., the electrodes 122a, 122b and 122c), an anisotropic conductive film 140 may also be attached to side surfaces and bottom surfaces of the second groove patterns 124a, 124b, and 124c. The anisotropic conductive film 140 may include conductive particles. The anisotropic conductive film 140 may have conductivity due to the conductive particles provided with a relatively small thickness in a vertical direction, whereas the anisotropic conductive film 140 may have non-conductivity with a relatively great thickness in a horizontal direction since the conductive particles are not connected to one another in the horizontal direction. Accordingly, the anisotropic conductive film 140 disposed on the side surfaces of the second groove patterns 124a, 124b, and 124c may have both a bonding function and an insulating function.

Although it is described that the anisotropic conductive film 140 is attached to the second groove patterns 124a, 124b, and 124c, as a bonding material, the bonding material is not limited to the anisotropic conductive film 140. Other bonding materials, for example, a solder ball, a metal paste, and the like may be used.

As shown in FIG. 1, in the nitride based semiconductor package 100, the nitride based semiconductor device 110 and the package substrate 150 may be connected electrically using the bonding substrate 120, rather than using wire bonding. Accordingly, a wiring space for the wire bonding may be unnecessary and thus a device size of the nitride based semiconductor device 110 and the package substrate 150 may be reduced.

In addition, in the nitride based semiconductor package 110, the first electrode pattern (e.g., the electrodes 114a, 114b and 114c) included in the nitride based semiconductor device 110 may be received in one surface of the bonding substrate 120 The third electrode pattern (e.g., the electrodes 151a, 151b and 151c) included in the package substrate 150 may be received at the other surface of the bonding substrate 120. Accordingly, a bonding area of each electrode pattern may increase, whereby a bonding force onto the bonding substrate 120 may be improved. In addition, each electrode pattern may be received in the bonding substrate 120, whereby a boning thickness may be reduced.

According to an example of the present disclosure, in order to increase the effects of improved bonding force and reduced bonding thickness, the first groove patterns 123a, 123b, and 123c of the bonding substrate 120 may have heights identical to a height of the first electrode pattern (e.g., the electrodes 114a, 114b and 114c), and the second groove patterns 124a, 124b, and 124c may have heights identical to a height of the third electrode pattern (e.g., the electrodes 151a, 151b and 151c). That is, the nitride based semiconductor package 100 may be configured such that the first electrode pattern may be received in the first groove patterns 123a, 123b, and 123c, and the $Al_xGa_{1-x}N$ layer 111 may be in contact with a surface of the bonding substrate 120. In addition, the nitride based semiconductor package 100 may be configured such that that the third electrode pattern may be received in the second groove patterns 124a, 124b, and 124c, and a surface of the package substrate 150 may be in contact with another surface of the bonding substrate 120.

According to an example of the present disclosure, the bonding substrate 120 may be a ceramic substrate having a thermal expansion coefficient identical to a thermal expansion coefficient of the nitride based semiconductor device 110. In addition, the bonding substrate 120 may include a conductive via (not separately shown) and a conductive pattern (not separately shown) to connect the second electrode pattern (e.g., the electrodes 121a, 121b and 121c) disposed on one surface of the bonding substrate 120, and the fourth electrode pattern (e.g., the electrodes 122a, 122b and 122c) disposed on the other surface of the bonding substrate 120.

FIGS. 2 through 7 are views illustrating a method of manufacturing a nitride based semiconductor package according to an example of the present disclosure.

Figure 2:
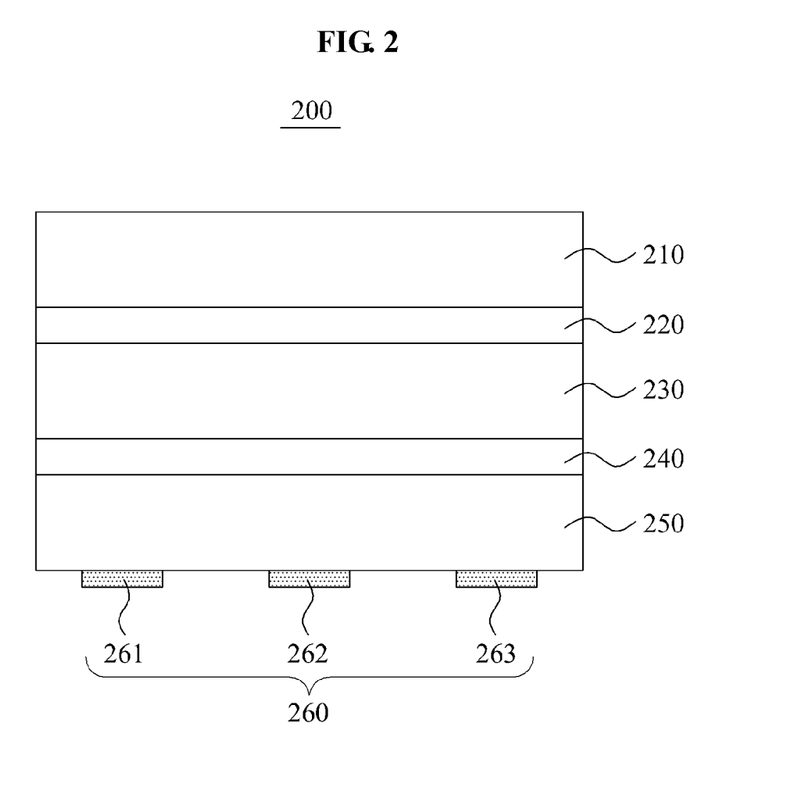
FIG. 2 is a view illustrating an operation or step of providing a nitride based semiconductor device according to an example of the present disclosure.

FIG. 2 is a view illustrating an operation or step of providing a nitride based semiconductor device 200 according to an example of the present disclosure.

Referring to FIG. 2, the nitride based semiconductor device 200 may be manufactured in the order of forming a buffer layer 220 on a sapphire substrate 210, subsequently forming s high-insulating GaN layer 230, an aluminum doped GaN layer 240, and an $Al_xGa_{1-x}N$ layer 250, and forming a first electrode pattern on the $Al_xGa_{1-x}N$ layer 250.

In particular, the method of manufacturing the nitride based semiconductor device 200, hereinafter referred to as the manufacturing method, may include a process of forming the buffer layer 220 by depositing silicon carbide (SiC) or GaN on the sapphire substrate 210 so that the high-insulating GaN layer 230 may have a high sheet resistance.

The manufacturing method may include a process of forming the high-insulating GaN layer 230 on the butter layer 220. The high-insulating GaN layer 230 may be deposited using Metal-Organic Chemical Vapor Deposition (MOCVD), Molecular Beam Epitaxy (MBE), Hydride Vapor Phase Epitaxy (HVPE), and the like.

In particular, relatively small grains may be formed on the buffer layer 220 by ramping the buffer layer 220 at a temperate ranging from 900° C. to 950° C. for about 4 minutes, while disposing, in a deposition chamber (not separately shown), the sapphire substrate 210 on which the buffer layer 220 is formed. Subsequently, by growing a GaN layer for about 1 to 5 minutes, and continuously growing the GaN layer while the temperate is increased to a range of 1020° C. to 1050° C., that is, for about 2 to 5 minutes, the high-insulating GaN layer 230 may be formed, and vacancies may be formed on the high-insulating GaN layer 230.

When the vacancies are formed to capture electrons, the high-insulating GaN layer 230 may have a higher resistance value, compared to a case in which a general GaN layer is doped with magnesium (Mg) or zinc (Zn). In addition, when the nitride based semiconductor device 200 operates, a malfunction due to an out-diffusion may be prevented. Thus, the GaN layer 230 with high insulation and high resistance may be formed at a low cost by a simple process.

The manufacturing method may include a process of forming the aluminum doped GaN layer 240 on the high-insulating GaN layer 230. By doping aluminum at a concentration of about 0.6 to 0.9%, a sheet carrier density of the GaN layer 240 may increase, and a channel layer with improved crystallizability may be obtained.

The manufacturing method may include a process of forming the $Al_xGa_{1-x}N$ layer 250 on the aluminum doped GaN layer 240. The $Al_xGa_{1-x}N$ layer 250 may be formed to have a thickness of about 25 to 40 nanometers (nm), and may contain aluminum of 20 to 45%.

In the nitride based semiconductor device 110, the high insulating GaN layer 230 may form a heterostructure with the aluminum doped GaN layer 240, and the $Al_xGa_{1-x}N$ layer 250.

Referring to FIG. 2, the manufacturing method may include a process of forming a first electrode pattern 260. A source electrode 261, a drain electrode 262, and a gate electrode 263 constituting the first electrode pattern 260 may be formed by patterning a metallic layer using a photolithography process after the metallic layer is deposited on a surface of the $Al_xGa_{1-x}N$ layer 250.

Figure 3:
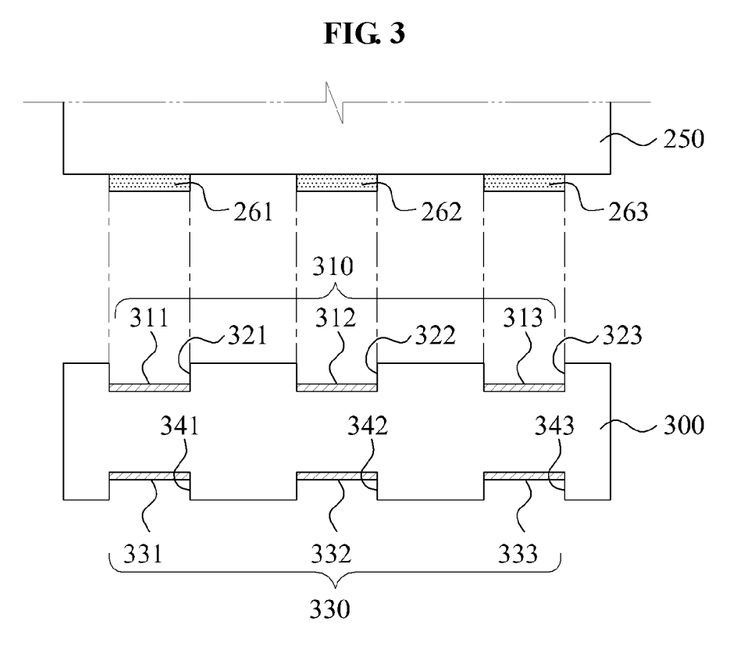
FIGS. 3 and 4 are views illustrating an operation or step of providing a bonding substrate according to an example of the present disclosure.
Figure 4:
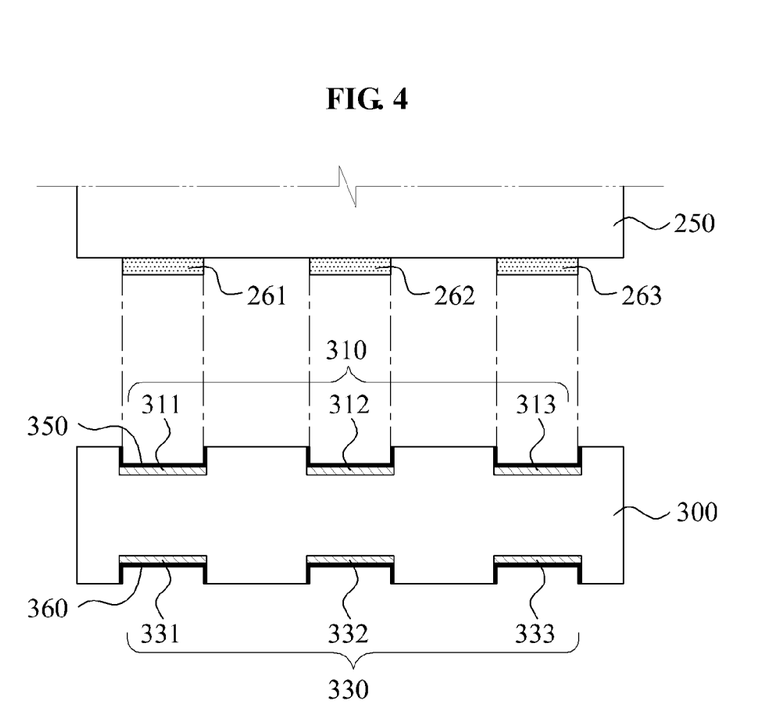

FIGS. 3 and 4 are views illustrating an operation or step of providing a bonding substrate 300 according to an example of the present disclosure.

Referring to FIG. 3, the bonding substrate 300 may include, on a surface, a second electrode pattern 310, and first groove patterns 321, 322, and 323. The bonding substrate 300 may include, on another surface, a fourth electrode pattern 330, and second groove patterns 341, 342, and 343.

The second electrode pattern 310 may include a first electrode 311, a second electrode 312, and a third electrode 313. The first groove patterns 321, 322, and 323 may be engraved patterns that are formed in an area in which the first electrode 311, the second electrode 312, and the third electrode 313 are disposed. The first groove patterns 321, 322, and 323 may expose the first electrode 311, the second electrode 312, and the third electrode 313 through bottom surfaces of the first groove patterns 321, 322, and 323.

When the bonding substrate 300 faces the nitride based semiconductor device 200 of FIG. 2, the first electrode 311, the second electrode 312, and the third electrode 313 may be disposed in an area corresponding to the first electrode pattern 260 (see FIG. 2) of the nitride based semiconductor device 200. In addition, the first groove patterns 321, 322, and 323 may have heights identical to a height of the first electrode pattern 260 so that the first electrode pattern 260 may be received in the first groove patterns 321, 322, and 323.

The fourth electrode pattern 330 may include a fourth electrode 331, a fifth electrode 332, and a sixth electrode 333. The second groove patterns 341, 342, and 343 may be engraved patterns that are formed in an area in which the fourth electrode 331, the fifth electrode 332, and the sixth electrode 333 are disposed. The second groove patterns 341, 342, and 343 may expose the fourth electrode 331, the fifth electrode 332, and the sixth electrode 333 through bottom surfaces of the second groove patterns 341, 342, and 343.

The fourth electrode pattern 330 and the second groove patterns 341, 342, and 343 may correspond to compositions to be used for bonding to a package substrate (not separately shown).

Referring to FIG. 4, the manufacturing method may include a process of attaching anisotropic conductive films 350 and 360. In particular, the anisotropic conductive film 350 may be attached to side surfaces and bottom surfaces of the first groove patterns 321, 322, and 323 (see FIG. 3) of the bonding substrate 300. The anisotropic conductive film 360 may be attached to side surfaces and bottom surfaces of the second groove patterns 341, 342, and 343 (see FIG. 3) of the bonding substrate 300.

Referring to FIG. 4, the anisotropic conductive films 350 and 360 may provide a bonding function and an insulating function on side surfaces of each groove pattern, and may provide a bonding function and a conducting function on bottom surfaces of each groove pattern.

The bonding substrate 300 may be formed by a ceramic substrate having a thermal expansion coefficient identical to a thermal expansion coefficient of the nitride based semiconductor device 200. The bonding substrate 300 may include a conductive via (not separately shown) and a conductive pattern (not separately shown) to connect the second electrode pattern 310 and the fourth electrode pattern 330.

Figure 5A:
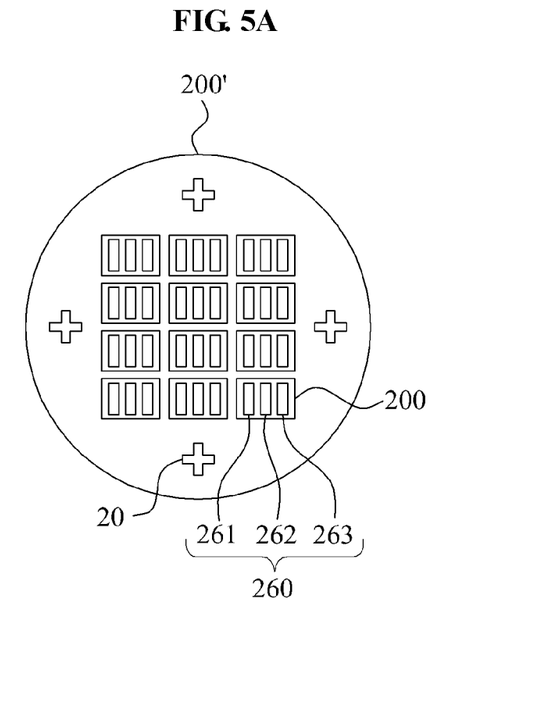
FIGS. 5A and 5B are views illustrating a surface of a nitride based semiconductor package and a surface of a bonding substrate that may face each other according to an example of the present disclosure.
Figure 5B:
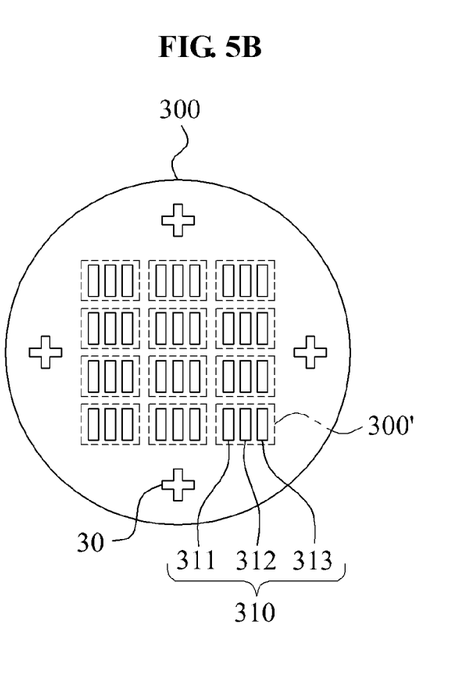

FIGS. 5A and 5B are views illustrating a surface of a nitride based semiconductor package and a surface of a bonding substrate that may face each other according to an example of the present disclosure.

Referring to FIG. 5A, a substrate 200' including a plurality of nitride based semiconductor devices 200 is illustrated. Referring to FIG. 5B, a bonding substrate 300 including bonding areas 300' corresponding to the plurality of nitride based semiconductor devices 200 is illustrated.

Each of the plurality of nitride based semiconductor devices 200 may include a first electrode pattern 260 formed by a source electrode 261, a drain electrode 262, and a gate electrode 263. In addition, in the bonding substrate 300 (see FIG. 5B), each of the bonding areas 300' may include, at a position corresponding to a position of the first electrode pattern 260, a second electrode pattern 310 formed by a first electrode 311, a second electrode 312, and a third electrode 313. Accordingly, the substrate 200' (see FIG. 5A) may be bonded to the bonding substrate 300 such that the first electrode pattern 260 may be bonded to the second electrode pattern 310. In order to improve a position accuracy when the bonding is performed, a plurality of first markers 20 may be marked on the substrate 200' in advance, and a plurality of second marker 30 (see FIG. 5B) may be marked on the bonding substrate 300 in advance. The substrate 200' and the bonding substrate 300 may be bonded such that the first markers 20 may match the second markers 30.

Figure 6:
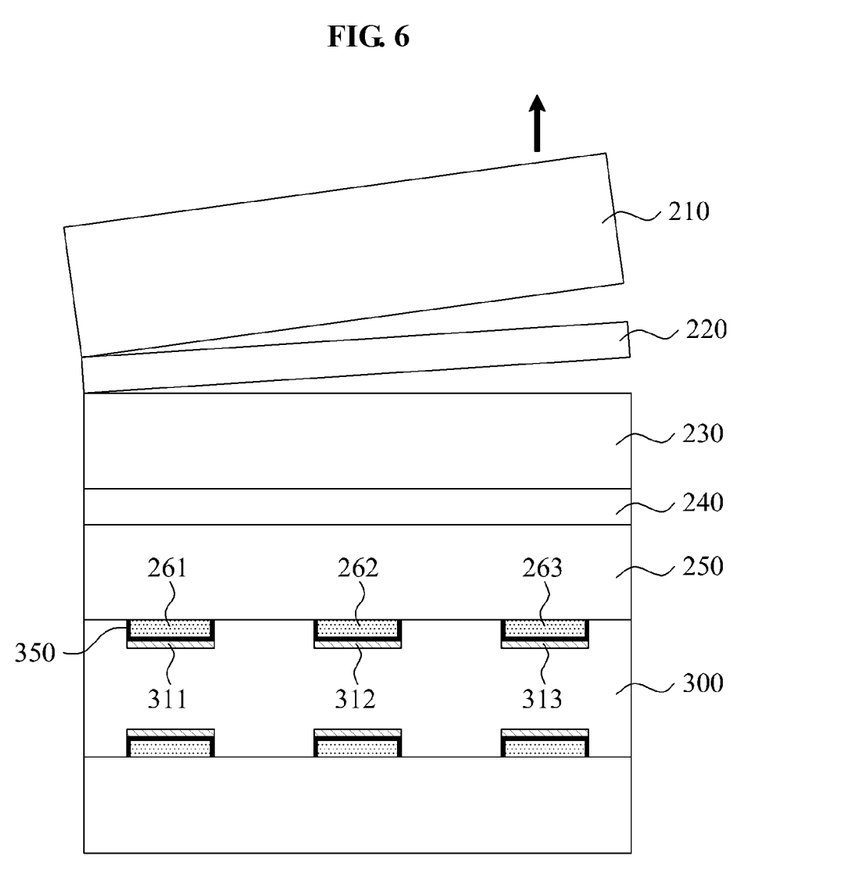
FIG. 6 is a view illustrating an operation or step of bonding a nitride based semiconductor device to a bonding substrate according to an example of the present disclosure.

FIG. 6 is a view illustrating an operation or step of bonding a nitride based semiconductor device to a bonding substrate according to an example of the present disclosure.

As described with reference to FIGS. 5A and 5B, when the substrate 200' is bonded to the bonding substrate 300, each unit device area may be provided in a bonding structure as shown in FIG. 6.

Referring to FIG. 6, in the nitride based semiconductor device 200, the first electrode pattern 260 (e.g., the electrodes 261, 262 and 263) may be received in the first groove patterns 321, 322, and 323 of the bonding substrate 300. Accordingly, the source electrode 261, the drain electrode 262, and the gate electrode 263 constituting the first electrode pattern 260 may be bonded to the first electrode 311, the second electrode 312, and the third electrode 313 that are exposed through bottom surfaces of the first groove patterns 321, 322, and 323, respectively.

When the nitride based semiconductor device 200 is bonded to the bonding substrate 300, a process of laser lift-off with respect to the sapphire substrate 210 and the buffer layer 220 may be performed (see FIG. 6). By removing the sapphire substrate 210 having a limitation to heat emission, heat generated when the nitride based semiconductor device 210 operates may be emitted to the outside rapidly.

Figure 7:
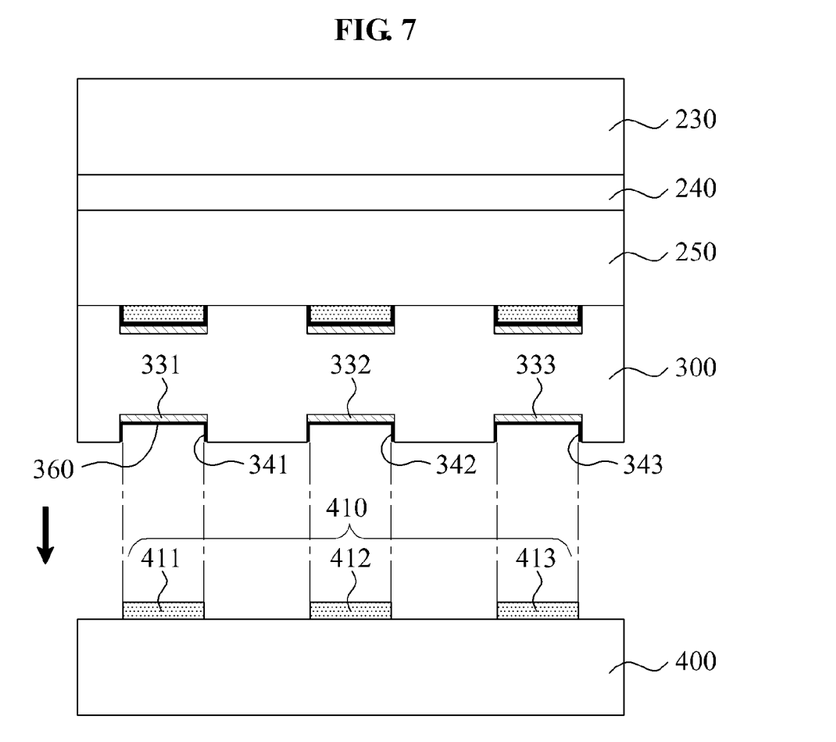
FIG. 7 is a view illustrating an operation or step of finishing a nitride based semiconductor package according to an example of the present disclosure.

FIG. 7 is a view illustrating an operation or step of finishing a nitride based semiconductor package according to an example of the present disclosure.

Referring to FIG. 7, the manufacturing method may include a process of bonding a package substrate 400 to the bonding substrate 300, to which the nitride based semiconductor device 200 is bonded. By the processes described above with reference to FIG. 7, a nitride based semiconductor package of a structure as shown in FIG. 3 may be manufactured.

The package substrate 400 may include a third electrode pattern 410 formed by a seventh electrode 411, an eighth electrode 412, and a ninth electrode 413. The third electrode pattern 410 may be formed at a position corresponding to a position of the fourth electrode pattern 330 (e.g., the electrodes 331, 332 and 333) of the bonding substrate 300.

During the process of bonding the bonding substrate 300 and the package substrate 400, the third electrode pattern 410 may be received in the second groove patterns 341, 342, and 343 of the bonding substrate 300. Accordingly, the seventh electrode 411, the eighth electrode 412, and the ninth electrode 413 may be bonded to the fourth electrode 331, the fifth electrode 332, and the sixth electrode 333 that are exposed through bottom surfaces of the second groove patterns 341, 342, and 343, respectively. The second groove patterns 341, 342, and 343 may have heights identical to a height of the third electrode pattern 410 so that the fourth electrode pattern 410 may be received in the second groove patterns 341, 342, and 343.

As shown in FIG. 7, since the nitride based semiconductor device 200 and the package substrate 400 may be electrically connected through the bonding substrate 300, wire bonding for the nitride based semiconductor package may be omitted. Accordingly, issues occurring during the process, e.g., an increase in a wiring space, a decrease in operating characteristics, and the like caused by the wire bonding, may be resolved.

In addition, since both the first electrode pattern 260 (see FIG. 2) of the nitride based semiconductor device 200, and the third electrode pattern 410 (see FIG. 7) of the package substrate 400 may be received in the first groove patterns 321, 322, and 323, and the second groove patterns 341, 342, and 343 of the bonding substrate 300, respectively, an increase in a thickness of the nitride based semiconductor package resulting from a bonding height may be prevented, and a short between electrodes constituting each electrode pattern may be prevented. Thus, a size of the entirety of the nitride based semiconductor package may be reduced, operating characteristics may be improved, and defective products may be reduced.

Although not separately shown in the drawings, according to another example of the present disclosure, a bonding substrate may be applicable to a Schottky barrier diode device, in addition to the nitride based semiconductor device 110 or 200 corresponding to a heterostructure field effect transistor (HFET). In this instance, the bonding substrate may include an electrode pattern formed by two electrodes corresponding to electrodes of the Schottky barrier diode device. In addition, the bonding substrate may be applicable to other electronic devices to be mounted on a package substrate.

Although examples of the present disclosure have been shown and described, it will be appreciated by those skilled in the art that changes may be made without departing from the principles and spirit of the present disclosure, the scope of which is defined in the appended claims.

What is claimed is:

1. A nitride based semiconductor package, comprising:
   a nitride based semiconductor device including, on a surface thereof, a first electrode pattern having a source electrode, a drain electrode, and a gate electrode;
   a package substrate; and
   a bonding substrate having a first surface and a second surface, including, on the first surface:
      a second electrode pattern corresponding to the first electrode pattern, and
      at least one first groove pattern to expose the second electrode pattern,
   wherein:
   the first electrode pattern is received in the at least one first groove pattern,
   the second electrode pattern is bonded to the first electrode pattern received in the at least one first groove pattern, the bonding substrate includes at least one second groove pattern on the second surface, and the package substrate includes a third electrode pattern and is bonded to the second surface of the bonding substrate such that the third electrode pattern is received in the at least one second groove pattern.

2. The nitride based semiconductor package of claim 1, further comprising:

a first anisotropic conductive film, attached to a side surface and a bottom surface of the first groove pattern to bond the first electrode pattern and the second electrode pattern.

3. The nitride based semiconductor package of claim 1, wherein a height of the at least one first groove pattern is identical to a height of the first electrode pattern.

4. The nitride based semiconductor package of claim 1, wherein the nitride based semiconductor device further includes at least one heterostructure layer.

5. The nitride based semiconductor package of claim 1, wherein the nitride based semiconductor device further includes:

a high insulating gallium nitride (GaN) layer;
an aluminum doped GaN layer disposed on the high insulating GaN layer; and
an aluminum gallium nitride ($Al_xGa_{1-x}N$) layer disposed on the aluminum doped GaN layer.

6. The nitride based semiconductor package of claim 1, wherein the third electrode pattern is electrically connected to the source electrode, the drain electrode, and the gate electrode.

7. The nitride based semiconductor package of claim 6, wherein:

the bonding substrate further includes, on the second surface thereof, a fourth electrode pattern corresponding to the third electrode pattern,
the at least one second groove pattern exposes the fourth electrode pattern, and
the fourth electrode pattern is bonded to the third electrode pattern received in the at least one second groove pattern.

8. The nitride based semiconductor package of claim 7, wherein the bonding substrate further includes:

a plurality of ceramic layers; and
a conductive via and a conductive pattern disposed on the plurality of ceramic layers to connect the second electrode pattern and the fourth electrode pattern.

9. The nitride based semiconductor package of claim 7, further comprising:

a second anisotropic conductive film, attached to a side surface and a bottom surface of the second groove pattern to bond the third electrode pattern and the fourth electrode pattern.

10. The nitride based semiconductor package of claim 7, wherein a height of the at least one second groove pattern is identical to a height of the third electrode pattern.

11. A bonding substrate for bonding a nitride based semiconductor device to a package substrate, the nitride based semiconductor device comprising, on a surface, a device electrode pattern having a source electrode, a drain electrode, and a gate electrode, the package substrate comprising a package electrode pattern to be electrically connected to the source electrode, the drain electrode, and the gate electrode, the bonding substrate comprising:

a first bonding electrode pattern disposed on a first surface of the bonding substrate, and corresponding to the device electrode pattern;

at least one first groove pattern to expose the first bonding electrode pattern, and to receive the device electrode pattern such that the device electrode pattern of the nitride based semiconductor device is bonded to the first bonding electrode pattern;

a second bonding electrode pattern disposed on a second surface of the bonding substrate, and corresponding to the package electrode pattern; and at least one second groove pattern to expose the second bonding electrode pattern, and to receive the package electrode pattern such that the package electrode pattern of the package substrate is bonded to the second bonding electrode pattern.

12. The bonding substrate of claim 11, wherein a height of the at least one first groove pattern is identical to a height of the device electrode pattern, and
a height of the at least one second groove pattern is identical to a height of the package electrode pattern.

13. A method of manufacturing a nitride based semiconductor package, the method comprising steps of:

providing a nitride based semiconductor device, such that the nitride based semiconductor device includes, on a surface thereof, a first electrode pattern having a source electrode, a drain electrode, and a gate electrode;

providing a bonding substrate, such that the bonding substrate includes, on a first surface thereof, a second electrode pattern corresponding to the first electrode pattern, includes, on the first surface thereof, at least one first groove pattern to expose the second electrode pattern, and includes, on a second surface thereof, at least one second groove pattern;

bonding the first electrode pattern included in the nitride based semiconductor device to the second electrode pattern such that the first electrode pattern is received in the at least one first groove pattern; and bonding a package substrate on the second surface of the bonding substrate such that the package substrate has a third electrode pattern on a surface thereof, and the third electrode pattern is received in the at least one second groove pattern.

14. The method of claim 13, further comprising:

attaching an anisotropic conductive film to a side surface and a bottom surface of the at least one first groove pattern before the first electrode pattern is received in the at least one first groove pattern.

15. The method of claim 13, wherein the step of bonding the package substrate comprises steps of:

providing the third electrode pattern to be electrically connected to the source electrode, the drain electrode, and the gate electrode;

providing, on the second surface of the bonding substrate, a fourth electrode pattern, such that the at least one second groove pattern exposes the fourth electrode pattern;

attaching an anisotropic conductive film to a side surface and a bottom surface of the at least one second groove pattern of the bonding substrate; and bonding the third electrode pattern to the fourth electrode pattern such that the third electrode pattern of the package pattern is received in the at least one second groove pattern to which the anisotropic conductive film is attached.

16. The method of claim 15, wherein a height of the at least one first groove pattern is identical to a height of the first electrode pattern, and a height of the at least one second groove pattern is identical to a height of the third electrode pattern.

17. The method of claim 13, wherein the providing of the nitride based semiconductor device comprises:
- forming a buffer layer on a sapphire substrate;
- forming a high insulating gallium nitride (GaN) layer on the butter layer;
- forming an aluminum doped GaN layer on the high insulating GaN layer; and
- forming an aluminum gallium nitride ($Al_xGa_{1-x}N$) layer on the aluminum doped GaN layer.

18. The method of claim 17, further comprising:
- performing a laser lift-off to remove the sapphire substrate and the buffer layer from the nitride based semiconductor device before the package substrate is bonded to the second surface of the bonding substrate.

* * * * *